US012787213B2

(12) United States Patent
Hyon et al.

(10) Patent No.: US 12,787,213 B2
(45) Date of Patent: Nov. 3, 2026

(54) POWER CONVERSION SYSTEM WITH A PLURALITY OF HEAT EMITTERS ON DIFFERENT SURFACES OF A HEATSINK AND INCLUDES A HEAT DISSIPATION FAN

(71) Applicant: KOREA ELECTRONICS TECHNOLOGY INSTITUTE, Seongnam-si (KR)

(72) Inventors: Byong Jo Hyon, Anyang-si (KR); Yongsu Noh, Seoul (KR); Sang Min Park, Bucheon-si (KR); Dongmyoung Joo, Bucheon-si (KR); Daeyeon Hwang, Incheon (KR); Poo Reum Jang, Incheon (KR); Hyoung-Kyu Yang, Seoul (KR); Jun Hyuk Choi, Bucheon-si (KR); Jin Hong Kim, Suwon-si (KR); Joon Sung Park, Seoul (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 203 days.

(21) Appl. No.: 18/541,919

(22) Filed: Dec. 15, 2023

(65) Prior Publication Data

US 2024/0215201 A1 Jun. 27, 2024

(30) Foreign Application Priority Data

Nov. 30, 2022 (KR) ........................ 10-2022-0164110
Jul. 17, 2023 (KR) ........................ 10-2023-0092244

(51) Int. Cl.
*H05K 7/20* (2006.01)
*H01G 2/08* (2006.01)
(Continued)

(52) U.S. Cl.
CPC ....... *H05K 7/20154* (2013.01); *H05K 7/1432* (2013.01); *H05K 7/14329* (2022.08);
(Continued)

(58) Field of Classification Search
CPC ............. H05K 7/1432; H05K 7/14329; H05K 7/20136; H05K 7/20145; H05K 7/20154;
(Continued)

(56) References Cited

U.S. PATENT DOCUMENTS 10,720,852 B1 * 7/2020 Soles ................. H05K 7/20872
11,778,793 B2 * 10/2023 Fujioka .............. H05K 7/14329 361/700
2012/0014063 A1 * 1/2012 Weiss ................. H05K 7/20909 361/697
(Continued)

FOREIGN PATENT DOCUMENTS

JP 2017013921 A 1/2017
KR 20180011606 A 2/2018
(Continued)

*Primary Examiner* — Jayprakash N Gandhi
*Assistant Examiner* — Steven Ngo
(74) *Attorney, Agent, or Firm* — McCoy Russell LLP

(57) ABSTRACT

Provided is a power conversion system including a heat sink, a first heat emitter provided on an upper surface of the heat sink, a second heat emitter electrically connected to the first heat emitter and provided on a lower surface of the heat sink, a third heat emitter provided on one side of the heat sink and spaced apart by a predetermined distance from the heat sink, and a heat dissipation fan provided in a direction facing the third heat emitter based on the heat sink and spaced apart by a predetermined interval from the third heat emitter, wherein, during a normal operation, more heat is emitted by the first heat emitter than by the second heat emitter.

9 Claims, 3 Drawing Sheets

(51) Int. Cl.
*H01H 9/52* (2006.01)
*H05K 7/14* (2006.01)
*H10W 40/43* (2026.01)

(52) U.S. Cl.
CPC ..... *H05K 7/20136* (2013.01); *H05K 7/20145* (2013.01); *H05K 7/20409* (2013.01); *H05K 7/20509* (2013.01); *H05K 7/209* (2013.01); *H05K 7/20909* (2013.01); *H01G 2/08* (2013.01); *H01H 9/52* (2013.01); *H10W 40/43* (2026.01)

(58) Field of Classification Search
CPC ........... H05K 7/20409; H05K 7/20509; H05K 7/20854; H05K 7/20863; H05K 7/209; H05K 7/20909; H01G 2/08; H01H 9/52; H01L 23/467
See application file for complete search history.

(56) References Cited

U.S. PATENT DOCUMENTS

| | | | | |
|---|---|---|---|---|
| 2015/0340961 | A1* | 11/2015 | Wen | H02M 7/003 363/37 |
| 2016/0241156 | A1* | 8/2016 | Kawakami | H02M 3/04 |
| 2019/0320555 | A1* | 10/2019 | Flavin | H05K 7/20409 |
| 2021/0226467 | A1* | 7/2021 | Chien-An | H05K 7/20409 |
| 2024/0380333 | A1* | 11/2024 | Lee | H05K 7/209 |
| 2024/0422952 | A1* | 12/2024 | Hattori | H02M 7/48 |
| 2025/0185221 | A1* | 6/2025 | Song | H02M 3/003 |

FOREIGN PATENT DOCUMENTS

| | | | |
|---|---|---|---|
| KR | 20180018060 | A | 2/2018 |
| KR | 20180038302 | A | 4/2018 |
| KR | 101892817 | B1 | 8/2018 |
| KR | 20220102361 | A | 7/2022 |

* cited by examiner

POWER CONVERSION SYSTEM WITH A PLURALITY OF HEAT EMITTERS ON DIFFERENT SURFACES OF A HEATSINK AND INCLUDES A HEAT DISSIPATION FAN

CROSS REFERENCE TO RELATED APPLICATIONS

The present application claims priority to Korean Patent Application No. 10-2022-0164110 filed on Nov. 30, 2022, and to Korean Patent Application No. 10-2023-0092244 filed on Jul. 17, 2023. The entire contents of the above-listed applications are hereby incorporated by reference for all purposes.

TECHNICAL FIELD

The following disclosure relates to a power conversion system.

BACKGROUND

A power system, a system that generates, transmits, and uses electrical energy, is used to deliver electricity produced by power plants to consumers. The power system includes power generation, transmission, and distribution. Specifically, power plants may produce electricity using various energy sources, transmit the electricity over long distances through a transmission system, and then supply electricity to consumers through a distribution system.

Power systems use various energy sources, and these energy sources have different characteristics. For example, solar power generation may generate direct current electricity, and wind power generation may generate alternating current electricity. In addition, a voltage and frequency of power may vary depending on the region. Therefore, a power conversion system (PCS) including a function to effectively manage various energy sources and voltages/frequencies and convert and distribute power is in demand. The PCS mainly performs DC-AC conversion, AC-DC conversion, voltage conversion, etc. and may be used to improve energy efficiency and power quality. The PCS may help to stably transfer power between power plants and consumers and efficiently utilize various energy sources.

In addition, the PCS may also be used in conjunction with energy storage devices in power systems. When used with an energy storage system (ESS), the PCS may improve the stability of a power grid by regulating flow of power and storing or releasing energy.

For example, the PCS may be a PCS product based on three-phase inverters. PCS products based on three-phase inverters adopt forced air cooling rather than water cooling. In this case, however, an inductor module is usually disposed on a power line including a printed circuit board (PCB) or a busbar on the same line as a SiC power module, so one heat emitter negatively affects the other heat emitter and increases a temperature of the entire system, making it difficult to effectively dissipate heat.

RELATED ART DOCUMENT

Patent Document

Korean Patent No. 10-1892817 ("Power conversion system", published on Aug. 28, 2018)

SUMMARY

An embodiment of the present invention is directed to providing a power conversion system having a structure capable of effectively dissipating heat from various heat-generating components, among the components in the power conversion system, by a single heat dissipation fan and heat sink.

In one general aspect, a power conversion system includes: a heat sink; a first heat emitter provided on an upper surface of the heat sink; a second heat emitter electrically connected to the first heat emitter and provided on a lower surface of the heat sink; a third heat emitter provided on one side of the heat sink and spaced apart by a predetermined distance from the heat sink; and a heat dissipation fan provided in a direction facing the third heat emitter based on the heat sink and spaced apart by a predetermined interval from the third heat emitter, wherein, during a normal operation, more heat is emitted by the first heat emitter than by the second heat emitter.

The power conversion system may further include: a case accommodating all of the heat sink, the first heat emitter, the second heat emitter, the third heat emitter, and the heat dissipating fan.

Each of three phases of the first heat emitter and the second heat emitter may be connected by a busbar or cable and may be connected to a space between the heat sink and the heat dissipation fan.

The first heat emitter and the second heat emitter may be connected to each other through a busbar, the heat sink may include at least one heat dissipation fin in which a width directional end faces the heat dissipation fan, a first busbar, which is a busbar located in the middle of the three busbars, may be disposed so that a width directional end faces the heat dissipation fan, and each of second and third busbars, which are the other busbars among the three busbars, may be disposed so that a side surface adjacent to the first busbar, among two side surfaces, faces the heat dissipation fan to a degree to guide air moving from the heat dissipation fan toward the heat sink.

The case may include one of aluminum, copper, and tungsten.

The case may include both an intake structure for intaking air into the inside of the case and an exhaust structure for discharging air in a direction opposite to the intaking direction.

The first heat emitter may include at least one SiC power module, and the SiC power module may be a module in which three-phase structures are internally integrated or includes three or more modules of respective phases.

The second heat emitter may include an inductor module including an inductor case and three or more inductors provided inside the inductor case, and the inductor may be molded and fixed inside the inductor case by a molding liquid.

The third heat emitter may include a plurality of capacitors, and the capacitors may be cylindrical high-voltage film capacitors provided in parallel.

Other features and aspects will be apparent from the following detailed description, the drawings, and the claims.

DETAILED DESCRIPTION OF EMBODIMENTS

In order to describe the present invention, the operational advantages of the present invention, and the objects achieved by the practice of the present invention, embodiments of the present invention are described.

Terms used in the present application are used only to describe specific exemplary embodiments, and are not intended to limit the present invention. A singular form may include a plural form if there is no clearly opposite meaning in the context. It will be further understood that the terms "comprises" or "have" used in this specification specify the presence of stated features, numerals, steps, operations, components, parts, or a combination thereof, but do not preclude the presence or addition of one or more other features, numerals, components, parts, or a combination thereof.

In describing the present invention, if it is determined that a detailed description of a related known configuration or function may obscure the gist of the present invention, the detailed description will be omitted.

Figure 1:
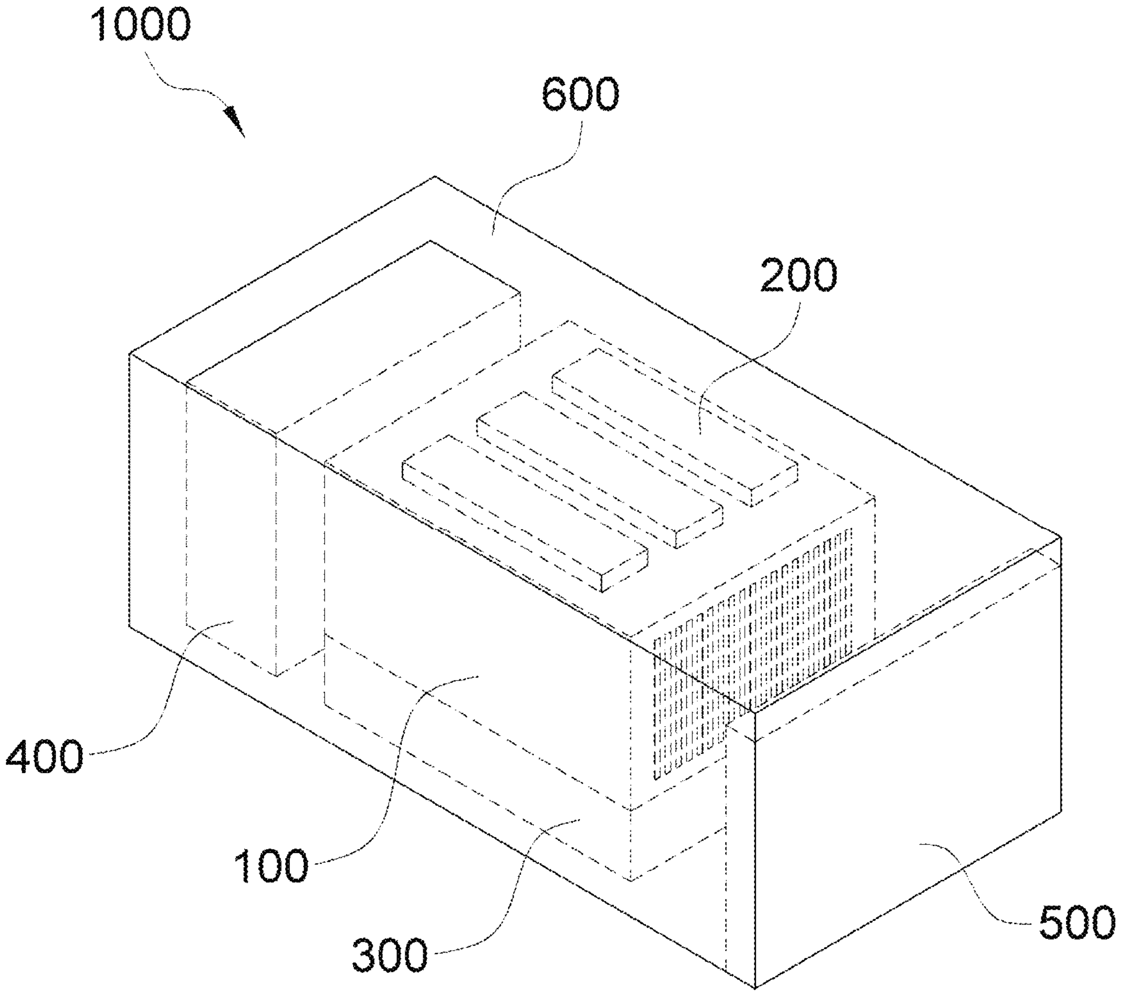
FIG. 1 is a schematic diagram illustrating a power conversion system according to an embodiment of the present invention.
Figure 2:
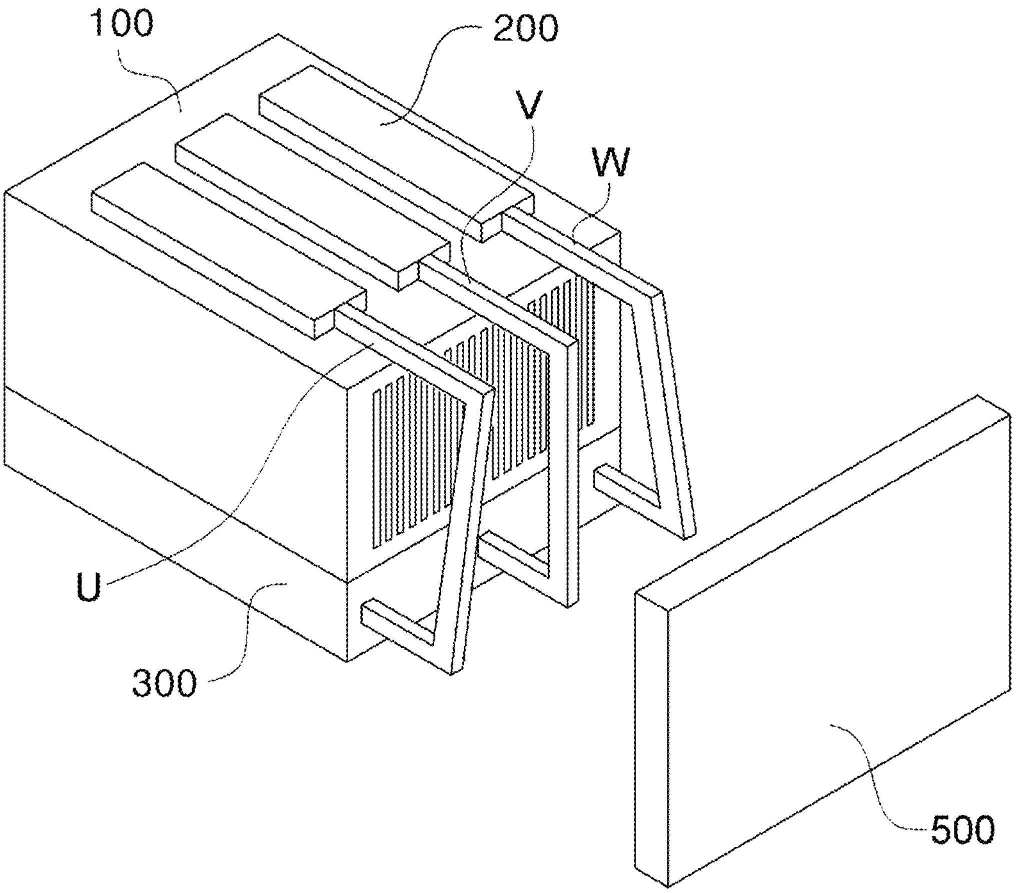
FIG. 2 is a schematic diagram illustrating the connection of the first busbar (V), the second busbar (U), and the third busbar (W) according to the present invention.

FIG. 1 is a schematic diagram illustrating a power conversion system according to an embodiment of the present invention.

As shown in FIG. 1, a power conversion system 1000 according to the present invention may include a heat sink 100, a first heat emitter 200, a second heat emitter 300, a third heat emitter 400, and a heat dissipation fan 500.

The first heat emitter 200 may be one module in which three-phase structures are internally integrated or may include three or more modules each configured to have one phase, and may be provided on one surface of the heat sink 100. Here, the power module 200 is preferably a SiC power module.

The second heat emitter 300 may be electrically connected to the first heat emitter 200. In addition, the second heat emitter 300 may be provided on the other side of the heat sink 100 and may include at least three inductors.

The third heat emitter 400 may be provided on one side of the heat sink 100 and may be spaced apart from the heat sink 100 by a predetermined distance.

The heat dissipation fan 500 may be provided at a predetermined interval in a direction facing the third heat emitter 400 based on the heat sink 100.

Specifically, among the components, the first heat emitter 200 generates the most heat during a normal operation, and thus, the first heat emitter 200 may be disposed on one surface of the heat sink 100, and the second heat emitter 300 may be disposed on the other surface of the heat sink 100, thereby preventing the second heat emitter 300 from being affected by heat emission from the first heat emitter 200. In addition, there is no need for a heat dissipation fan or heat dissipation pipe to cool a filter unit including a separate inductor.

Hereinafter, the first heat emitter 200 is described in detail as a power module 200, the second heat emitter 300 is described as an inductor module 300, and the third heat emitter 400 is described as a capacitor 400.

Since the power conversion system 1000 according to the present invention is designed based on three-phase AC output, the power module 200 may be one module in which three-phase structures are internally integrated or may include three or more modules each configured as one phase module.

The inductor module 300 may include an inductor case and three or more inductors provided in the inductor case.

Here, at least three inductors may be molded and fixed inside the inductor case using a molding liquid.

Accordingly, since cooling performance of the heat sink 100 is designed to a level that may handle the existing rated inverter module, the size of the heat sink 100 may not increase compared to a heat dissipation system of the conventional power conversion system.

Meanwhile, the capacitor 400 and the heat dissipation fan 500 may be provided to be spaced apart from each other at a predetermined interval based on the heat sink 100.

In other words, the capacitor 400 may be provided at a predetermined distance from the heat dissipation fan 500 and may be provided at a final heat dissipation end, and thus, a temperature diffusion due to a temperature difference of heat may be effectively performed.

Here, the capacitor 400 may be provided with cylindrical high-voltage film capacitors in parallel and may filter an input DC voltage of the power conversion system 1000.

The heat dissipation fan 500 is also preferably provided at a predetermined interval based on the heat sink 100.

Figure 3:
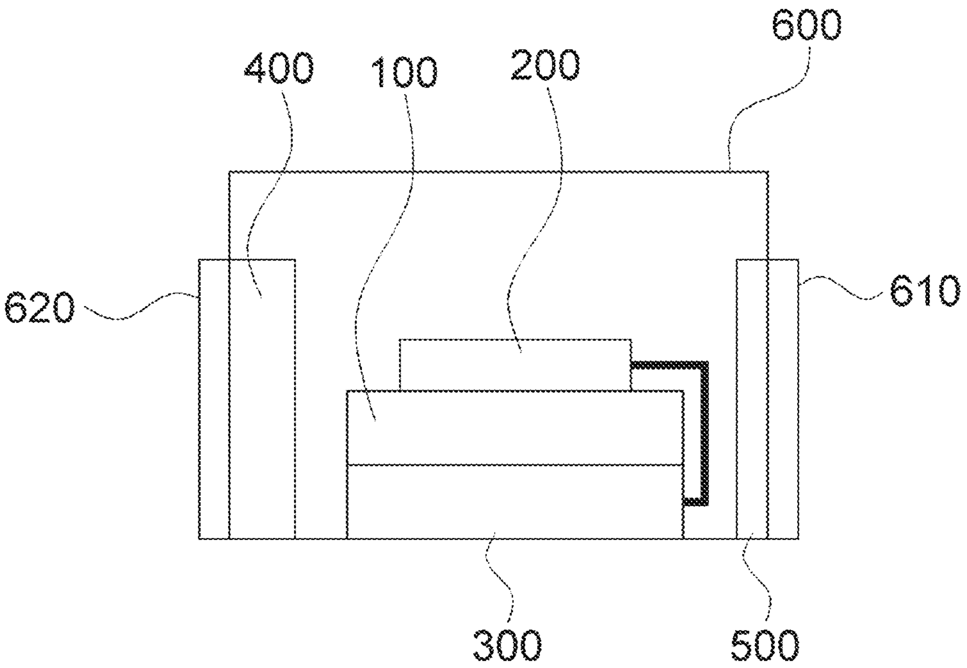
FIG. 3 is a schematic diagram illustrating the intake structure and the exhaust structure of the case according to the present invention.

In addition, FIG. 3 shows that the case 600 may include both an intake structure 610 that intakes air into the inside of the case 600 and an exhaust structure 620 that discharges air in a direction opposite to an intaking direction.

In addition, the power module 200 and the inductor module 300 may be connected to each other in each of the three phases by a busbar or cable, and the connection may be made in a space between the heat sink 100 and the heat dissipation fan 500.

Furthermore, a first busbar located in the middle of the three busbars may be connected at the same angle as that of a fin of the heat sink 100, and the remaining busbars among the three busbars, the second and third busbars, may be connected, while forming a predetermined angle.

Specifically, the power module 200 and the inductor module 300 may be connected to each other through a busbar, and the heat sink 100 may include at least one heat dissipation fin. Here, the heat dissipation fin may be disposed so that a width directional end of the heat sink 100 faces the heat dissipation fan 500.

In addition, the first busbar may be disposed so that a width directional end thereof faces the heat dissipation fan 500, and each of the second busbar and the third busbar is disposed such that a side surface adjacent to the first busbar, among two side surfaces, faces the heat dissipation fan to a degree to guide air moving from the heat dissipation fan toward the heat sink 100.

Due to this connection structure, air may be guided from the heat dissipation fan 500 toward the heat sink 100, thereby effectively forming an air circulation path without obstructing a flow path of the heat dissipation fan 500.

Meanwhile, the power conversion system 1000 according to the present invention may further include a case 600.

The case 600 may be formed of a material having a thermal conductivity equal to or higher than a predetermined reference, and in particular, may be one of aluminum, copper, tungsten, and iron.

In addition, the case 600 may accommodate the heat sink 100, the power module 200, the inductor module 300, the capacitor 400, and the heat dissipation fan 500, thereby effectively dissipating heat from the inductor module 300 that emits a large amount of heat.

In addition, the inductor module 300 serving as a three-phase reactor filter may be provided on the other surface of the heat sink to be cooled, and specifically, a plurality of inductors included in the inductor module 300 may be packed with a molding liquid having thermal conductivity equal to or greater than a predetermined reference and may be heat-dissipated through a lower portion of the case 600 through a formed resin layer.

In addition, the power conversion system 1000 according to the present invention includes the power module 200, the inductor module 300, and the capacitor 400, which are the main heat emitters (first to third heat emitters), and may have an effective cooling structure with the single heat sink 100.

In addition, the busbar may be at an angle not interfering with a flow path of the heat dissipation fan 500, thereby effectively performing temperature diffusion due to a temperature difference and achieving high power density of the power conversion system 1000.

In the power conversion system according to various embodiments of the present invention as described above, cooling may be performed by arranging three inductors that serve as a three-phase reactor filter below the heat sink.

In addition, the three inductors are packed with a molding liquid having high thermal conductivity, obtaining the effect of dissipating heat through a lower portion of the case using a resin layer.

In addition, by disposing the SiC power module, which emits the most heat, at the top, it is possible to prevent the inductor module from being affected by high heat.

In addition, the heat emitting portion including the SiC power module, the inductor module, and the capacitor may be effectively heat-dissipated within the same case volume as that of the existing PCS or a limited case volume by using the single heat dissipation fan.

Although the embodiments of the present invention have been described above, the present invention is not limited to the specific embodiments described above. That is, those skilled in the art to which the present invention pertains may make many changes and modifications to the present invention without departing from the spirit and scope of the appended claims, and all such appropriate changes and modifications are equivalents and should be considered to fall within the scope of the present invention.

DETAILED DESCRIPTION OF MAIN ELEMENTS

1000: power conversion system
100: heat sink
200: first heat emitter (power module)
300: second heat emitter (inductor module)
400: third heat emitter (capacitor)
500: heat dissipation fan
600: case

What is claimed is:

1. A power conversion system comprising:
a heat sink;
a first heat emitter;
a second heat emitter electrically connected to the first heat emitter;
a third heat emitter provided on one side of the heat sink and spaced apart by a predetermined distance from the heat sink; and
a heat dissipation fan provided in a direction facing the third heat emitter based on the heat sink and spaced apart by a predetermined interval from the third heat emitter,
wherein the heat sink includes a first main surface facing upward with respect to a gravity direction in a use state and a second main surface facing downward opposite to the first main surface,
wherein the first heat emitter is provided on the first main surface of the heat sink,
wherein the second heat emitter, which emits less heat than the first heat emitter during normal operation, is provided on the second main surface of the heat sink so that the second heat emitter is prevented from being affected by heat generated from the first heat emitter, and
wherein the heat dissipation fan, the heat sink, and the third heat emitter are arranged such that a flow path of cooling air moved by the heat dissipation fan sequentially passes through a first-main-surface-side region in which the first heat emitter is provided, a second-main-surface-side region in which the second heat emitter is provided, and a side of the third heat emitter.

2. The power conversion system of claim 1, further comprising:
a case accommodating the heat sink, the first heat emitter, the second heat emitter, the third heat emitter, and the heat dissipation fan.

3. The power conversion system of claim 1, wherein each of three phases of the first heat emitter and the second heat emitter is connected by a plurality of busbars or a cable and is connected to a space between the heat sink and the heat dissipation fan.

4. The power conversion system of claim 3, wherein
the first heat emitter and the second heat emitter are connected to each other through the plurality of busbars,
the heat sink includes at least one heat dissipation fin in which a width directional end of the at least one heat dissipation fin faces the heat dissipation fan,
a first busbar, which is a busbar of the plurality of busbars located in the middle of the plurality of busbars, is disposed so that a width directional end of the first busbar faces the heat dissipation fan, and
each of the second and the third busbars, which are the other busbars among the plurality of busbars, is disposed so that a side surface adjacent to the first busbar, among two side surfaces, faces the heat dissipation fan to a degree to guide air moving from the heat dissipation fan toward the heat sink.

5. The power conversion system of claim 2, wherein the case comprises one of aluminum, copper, and tungsten.

6. The power conversion system of claim 2, wherein the case includes both an intake structure for intaking air into an inside of the case and an exhaust structure for discharging air in a direction opposite to an intaking direction.

7. The power conversion system of claim 1, wherein
the first heat emitter includes at least one SiC power module, and
the at least one SiC power module is a module in which a three-phase structure is internally integrated or includes three or more modules of respective phases.

8. The power conversion system of claim 1, wherein
the second heat emitter includes an inductor module including an inductor case and three or more inductors provided inside the inductor case, and
the inductor module is molded and fixed inside the inductor case by a molding liquid.

9. The power conversion system of claim 1, wherein the third heat emitter includes a plurality of capacitors, and the plurality of capacitors are cylindrical high-voltage film capacitors provided in parallel.

* * * * *